US011170545B2

(12) United States Patent
Chandarana et al.

(10) Patent No.: US 11,170,545 B2
(45) Date of Patent: Nov. 9, 2021

(54) SYSTEMS AND METHODS FOR DIAGNOSTIC ORIENTED IMAGE QUALITY ASSESSMENT

(71) Applicants: NEW YORK UNIVERSITY, New York, NY (US); SIEMENS MEDICAL SOLUTIONS USA, INC., Malvern, PA (US)

(72) Inventors: Hersh Chandarana, Scarsdale, NY (US); Tiejun Zhao, Skilllman, NJ (US); Xiaoguang Lu, West Windsor, NJ (US)

(73) Assignees: New York University, New York, NY (US); Siemens Medical Solutions USA, Inc., Malvern, PA (US)

( * ) Notice: Subject to any disclaimer, the term of this patent is extended or adjusted under 35 U.S.C. 154(b) by 194 days.

(21) Appl. No.: 16/255,772

(22) Filed: Jan. 23, 2019

(65) Prior Publication Data

US 2019/0228547 A1 Jul. 25, 2019

Related U.S. Application Data

(60) Provisional application No. 62/621,424, filed on Jan. 24, 2018.

(51) Int. Cl.
*G06K 9/00* (2006.01)
*G06T 11/00* (2006.01)
*G06N 20/00* (2019.01)
*G06N 3/08* (2006.01)
(Continued)

(52) U.S. Cl.
CPC ........ *G06T 11/008* (2013.01); *G01R 33/5608* (2013.01); *G06N 3/08* (2013.01);
(Continued)

(58) Field of Classification Search
None
See application file for complete search history.

(56) References Cited

U.S. PATENT DOCUMENTS

| 2005/0113960 | A1* | 5/2005 | Karau | A61B 6/032 |
| | | | | 700/182 |
| 2007/0076959 | A1* | 4/2007 | Bressan | H04N 19/176 |
| | | | | 382/224 |

(Continued)

OTHER PUBLICATIONS

Brosch, et al., "Deep 3D Convolutional Encoder Networks With Shortcuts for Multiscale Feature Integration Applied to Multiple Sclerosis Lesion Segmentation," IEEE Transactions on Medical Imaging 35(5), pp. 1229-1239 (2016).

(Continued)

*Primary Examiner* — Suhail Khan
(74) *Attorney, Agent, or Firm* — Foley & Lardner LLP

(57) ABSTRACT

A method for real-time assessment of image information employing a computer that includes one or more processors includes obtaining, via a scanner, a magnetic resonance (MR) image of a region-of-interest, and providing data corresponding to at least a portion of the MR image to a deep learning model, where the deep learning model is previously trained based on one or more sets of training data. The method further includes assessing the data using the deep learning model and data obtained from an image quality database to obtain an assessed image quality value, and formulating an image quality classification in response to the assessed image quality value. The method additionally includes outputting the image quality classification within a predetermined time period from an initial scan of the region-of-interest.

12 Claims, 4 Drawing Sheets

(51) Int. Cl.
*G06T 7/00* (2017.01)
*G01R 33/56* (2006.01)
*G01R 33/483* (2006.01)

(52) U.S. Cl.
CPC ........... *G06N 20/00* (2019.01); *G06T 7/0012* (2013.01); *G01R 33/483* (2013.01); *G06T 2207/10088* (2013.01); *G06T 2207/20084* (2013.01); *G06T 2207/30168* (2013.01)

(56) References Cited

U.S. PATENT DOCUMENTS

2015/0313445 A1* 11/2015 Davidson ........... A61B 1/00006
600/109
2018/0144466 A1* 5/2018 Hsieh ................... G06T 7/0012

OTHER PUBLICATIONS

Eck, et al., "Computational and human observer image quality evaluation of low dose, knowledge-based CT iterative reconstruction," Medical Physics 42(10), pp. 6098-6111 (2015).

He, et al., "Identity Mappings in Deep Residual Networks," Lecture Notes in Computer Science 9908: Computer Vision—ECCV 2016, pp. 630-645 (2016).

Hou, et al., "Blind Image Quality Assessment via Deep Learning," IEEE Transactions on Neural Networks and Learning Systems 26(6), pp. 1275-1286 (2015).

Kang, et al., "Convolutional Neural Networks for No-Reference Image Quality Assessment," 2014 IEEE Conference on Computer Vision and Pattern Recognition, pp. 1733-1740 (2014).

Krizhevsky, et al., "ImageNet Classification with Deep Convolutional Neural Networks," Advances in Neural Information Processing Systems 25, 9 pages (2012).

Simonyan & Zisserman, "Very Deep Convolutional Networks for Large-Scale Image Recognition," Sixth International Conference on Learning Representations, 14 pages (2015).

Szegedy, et al., "Going Deeper With Convolutions," IEEE Conference on Computer Vision and Pattern Recognition, 9 pages (2015).

Zeiler & Fergus, "Visualizing and Understanding Convolutional Networks," Lecture Notes in Computer Science 8689: Computer Vision—ECCV 2014, pp. 818-833 (2014).

* cited by examiner

SYSTEMS AND METHODS FOR DIAGNOSTIC ORIENTED IMAGE QUALITY ASSESSMENT

CROSS REFERENCE TO RELATED APPLICATIONS

This application claims the benefit of U.S. Provisional Application No. 62/621,424 filed Jan. 24, 2018, hereby incorporated by reference in its entirety.

FIELD OF THE INVENTION

The present invention generally relates to quality assessment of Magnetic Resonance Imaging (MRI) data. In particular, the present invention relates to evaluating MRI images using deep learning techniques.

BACKGROUND

Data from MRI images may be used across the entire clinical imaging workflow, including in diagnosis, patient therapy planning, intervention, and follow-up. For example, abdominal MR imaging is routinely performed to evaluate chronic liver diseases such as liver cirrhosis and for detection and characterization of focal liver lesions. However, certain MRI techniques, including those for liver MRI, suffer from limitations including inconsistent and low image quality and decreased robustness.

After MRI data is obtained from a patient, the resulting images may be of such low quality so as to be unusable. However, a practitioner may not realize that the image is of low quality until after the medical examination has already been completed and the patient has left. Also, traditional methods of assessing image quality are limited and do not account for task-specific quality considerations, e.g., the attributes associated with the image being of adequate diagnostic quality for a particular task, such as detection of lesions in the liver. Traditional methods may require first identifying a potential condition through the MRI, such as an issue with the liver, and then determining if the MRI data is of sufficient quality for the type of analysis necessary for the identified condition. This two-step process is slow and requires input from experts, and is usually not 'real-time'. Although liver MRI is a powerful tool, it suffers from a number of limitations, namely inconsistent image quality and decreased robustness, which are likely related to the relatively long acquisition time and need for acquiring data in multiple breath-holds.

The present disclosure is directed to overcoming these and other deficiencies.

SUMMARY

In one implementation, the disclosure describes a method for real-time assessment of image information, such as image quality information, employing a computer that includes one or more processors. includes obtaining, via a scanner, a magnetic resonance (MR) image of a region-of-interest, and providing data corresponding to at least a portion of the MR image to a deep learning model, where the deep learning model is previously trained based on one or more sets of training data. The deep learning model labels each image with an image quality score and provides an image quality label to an acquisition or study for the task at hand.

In the implementation described above, the method may further include assessing the data using the deep learning model and data obtained from an image quality database to obtain an assessed image quality value, and formulating an image quality classification in response to the assessed image quality value. The method additionally includes outputting the image quality classification in a predetermined time period from an initial scan.

In another implementation, the disclosure describes a computer readable non-transitory storage media including a processor configured to execute instructions for assessing magnetic resonance (MR) image quality. The instructions comprise providing imaging data to a deep learning model, wherein the deep learning model incorporates training data derived from a plurality of training images; assessing the imaging data using the deep learning model, wherein the imaging data contains at least a portion of an MR image acquired of the region-of-interest; outputting an instruction to re-scan the region-of-interest when an image quality assessment of the MR image is below a threshold; and training the deep learning model based on at least the assessment of the imaging data and based on whether or not a subsequent re-scan is performed.

In a further implementation, the disclosure describes a system for real-time assessment of magnetic resonance (MR) images, comprising a network computer, including a memory configured to store data derived from a plurality of networked imaging devices; and a processor configured to execute instructions stored in the memory. The instructions include providing at least a portion of the data to a deep learning model, the deep learning model comprising a plurality of connected nodes forming a hierarchical representation of a plurality of MR images, assessing the data using the deep learning model and one or more image quality metrics; training the deep learning model based on at least the one or more image quality metrics and a portion of the data corresponding to a previously acquired MR image of region-of-interest; and generating a classification of image quality of the previously acquired MR image while the region-of-interest is present in one of the imaging devices.

BRIEF DESCRIPTION OF THE FIGURES

The details of one or more embodiments are set forth in the accompanying drawings and the description below. Other features, aspects, and advantages of the disclosure will become apparent from the description, the drawings, and the claims. In the drawings, like reference numerals are used throughout the various views to designate like components.

Figure 1:
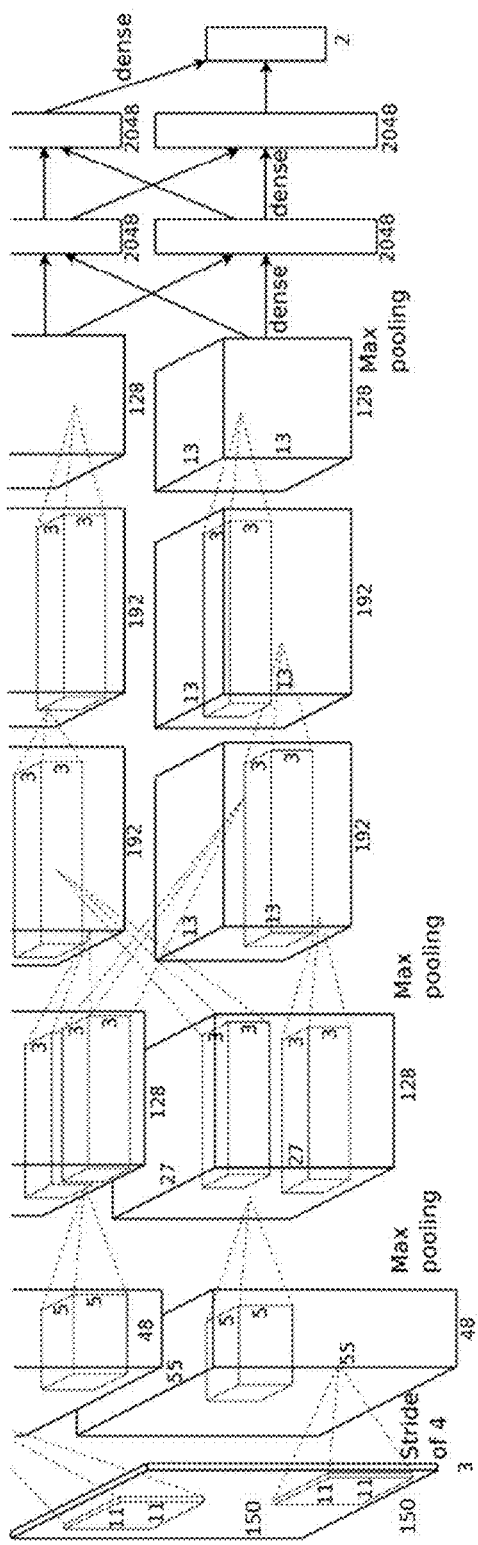
FIG. 1 illustrates a neural network architecture according to an exemplary implementation.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

DETAILED DESCRIPTION

Various embodiments are described hereinafter. It should be noted that the specific embodiments are not intended as an exhaustive description or as a limitation to the broader aspects discussed herein. One aspect described in conjunction with a particular embodiment is not necessarily limited to that embodiment and can be practiced with any other embodiment(s).

As used herein and in the appended claims, singular articles such as "a" and "an" and "the" and similar references in the context of describing the elements (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein.

The embodiments, illustratively described herein may suitably be practiced in the absence of any element or elements, limitation or limitations, not specifically disclosed herein. Thus, for example, the terms "comprising," "including," "containing," etc. shall be read expansively and without limitation. Additionally, the terms and expressions employed herein have been used as terms of description and not of limitation, and there is no intention in the use of such terms and expressions of excluding any equivalents of the features shown and described or portions thereof, but it is recognized that various modifications are possible within the scope of the claimed technology. Additionally, the phrase "consisting essentially of" will be understood to include those elements specifically recited and those additional elements that do not materially affect the basic and novel characteristics of the claimed technology. The phrase "consisting of" excludes any element not specified. The expression "comprising" means "including, but not limited to." Thus, other non-mentioned components or steps may be present. Unless otherwise specified, "a" or "an" means one or more.

Unless otherwise indicated, all numbers expressing quantities of properties, parameters, conditions, and so forth, used in the specification and claims are to be understood as being modified in all instances by the term "about." Accordingly, unless indicated to the contrary, the numerical parameters set forth in the following specification and attached claims are approximations. Any numerical parameter should at least be construed in light of the number reported significant digits and by applying ordinary rounding techniques. The term "about" when used before a numerical designation, e.g., temperature, time, amount, and concentration including range, indicates approximations which may vary by (+) or (−) 10%, 5% or 1%.

As will be understood by one of skill in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member.

As indicated above, current medical imaging analysis generally does not routinely provide fast and robust image quality assessment. As a result, often by the time radiologists notice that the image quality is inferior, the examination itself is already completed and patient has left the clinic. Thus, human, even expert, review of MRI images suffers from inter-observer variability. Automating aspects of image assessment itself using machine learning may speed up the image assessment process and enhance the accuracy of the assessment, and avoid having to summon the patient back to the clinic for repeat scanning.

Accordingly, certain exemplary embodiments set forth herein allow for automatic assessment of image quality in real time, during the acquisition of magnetic resonance (MR) data from the patient. By assessing image quality in real time, such exemplary techniques permit corrective action while patient is on the scanner, thus improving robustness and quality of the MR exam. For example, in certain embodiments, the assessment of image quality may take less than 1 second. Thus, if the assessment indicates that further scanning is needed, the inconvenience to the patient is minimized. In other words, if the output of the assessment is a classification of the image quality, then that classification may be communicated within a short period of time from the initial scan, including when the patient is still in the scanner or present during their appointment and has not yet left the medical practitioner's facility.

Accordingly, in some embodiments, the image quality assessment may be carried out within a predetermined time period from an initial scan. The predetermined time period may be less than 10 seconds, less than 5 seconds, less than 2 seconds, or less than 1 second, for example. Such embodiments permit identification and notification of the need for corrective action—e.g., further calibration or adjustment of scanning protocols—to be carried out relatively quickly.

Traditional methods of assessing image quality rely on measures such as artifacts, signal, signal to noise ratio (SNR), and contrast to noise ratio (CNR), for example. However, these approaches are severely limited and ill-suited to advance image acquisition and reconstruction. Measures such as SNR are global measures of image quality which are not task specific and do not capture what a radiologist may consider to be images of sufficient diagnostic quality. For example, an artifact in a region outside the region or organ of interest (for example, in an area outside of the liver) may be present. Such quantitative global measures would consider the image to be non-diagnostic due to the presence of the artifact. However, a radiologist, as an expert reviewer of the image, may determine that the image itself is in fact diagnostic if the artifact is not present in the region being evaluated (i.e., does not obstruct the liver).

Moreover, the above methods fail to fully account for indicators of "good quality" or "diagnostic image quality" for a specific task. In other words, the metric of quality used by an SNR approach, for example, does not account for the specific quality considerations associated with a particular type of imaging, such as MR imaging for detecting lesions in the liver. Currently, trained human observers (e.g., radiologists or other medical practitioners) are needed to gauge task-specific image quality. However, relying on human observers to assess task-specific image quality has numerous drawbacks, including being expensive, inefficient, and inconsistent. Requiring human input slows down the clinical imaging workflow.

Further, there is tremendous inter-reader variability, e.g., due to subjective quality determinations reflecting each observer's particular assessment, training and individual heuristics. Generally speaking, automating such an assessment is difficult, at least because the assessment is task-dependent, subjective, and complex due to a plurality of artifacts and anatomical variations, among other reasons. As indicated above, if there is an artifact that is present in the part of the images, and that artifact does not obscure evaluation of a region or organ of interest, such as the liver, then a radiologist may still consider the images to be of diagnostic quality, even though the artifact or noise may be present.

In at least one embodiment, automating the image assessment process includes using a discriminative learning framework that may employ image features extracted from training images to train classifiers for image assessment. Such learning frameworks may be used to assess image quality from images obtained in various two-dimensional (2D) and three-dimensional (3D) medical imaging modalities. In at least one embodiment, the automated image quality assessment accounts for task-specific factors, a plurality of artifacts and anatomical variations.

Automated image quality assessment (IQA) may be classified into three categories: full-reference IQA, reduced-reference IQA, and no-reference/blind IQA (NR-IQA). Full-reference image quality assessment (FR-IQA) techniques compare a reference and a test image, and predict the quality of the test image in terms of a scalar value representing an objective score. On the other hand, NR-IQA or "blind" image quality assessment does not rely on any reference information, and is generally more practical while nonetheless being an extremely difficult task (especially for general-purpose metrics that are applicable to a wide variety of image distortion types). RR-IQA lies between FR and NR models, and is designed to predict the quality of images with only partial information about the reference images.

Substantial automated image quality assessment efforts have focused on natural images. Natural images may be less relevant to medical images, which are generated by subjecting anatomical objects to imaging for the purpose of creating visual representations of anatomies, so as to reveal internal structures not otherwise visible. Various image artifacts in MR images are not generally an issue in natural imaging, such as artifacts induced by scanning hardware (e.g., field inhomogeneity) and/or patients (e.g., a patient's motion during scanning).

In at least one embodiment, a fully automated NR-IQA approach employs deep learning based methods to conduct a diagnosis-oriented image quality assessment. For example, the image quality assessment may be performed for a liver MRI, for liver lesion detection. The automated image quality assessment takes place in real time at the scanner, so as to enable feedback at the time of scanning and thereby improve the robustness and diagnostic utility of MR examinations. While the present disclosure addresses liver MR in particular, it should be understood that the exemplary techniques set forth herein are not limited to liver MR and encompass image quality assessment for other task-specific applications.

In at least one embodiment, image quality assessment may be carried out using deep networks, of which neural networks are an exemplary and non-limiting example. Deep learning (DL) is rapidly growing into the main stream of machine learning research and practice. It is considered to be in the "next generation" of artificial intelligence and is a powerful data analytics tool. DL methods have been used to analyze natural images. However, as stated above, medical images, and especially MR images, pose additional challenges, such as image artifacts in MR images which are not present in the natural images, the lack of 'perfect' or 'near-perfect' reference images, and difficulty in quantifying task-specific acceptable image quality.

Furthermore, general neural networks are difficult to scale to input with high dimensions (such as images containing thousands or even millions of pixels), because their fully-connected nature includes many more free parameters for learning than the available training data points. The objective function used to learn the parameters may lead to a local minimum in optimization and overfitting. In a neural network, weights of edges connecting the nodes are free parameters to be learned. In a fully connected network, nodes between two adjacent neural network layers are fully connected, resulting in a large combinatorial number of free parameters. Thus, with a limited number of training samples in the high-dimensional image space, fully connected neural nets are prone to overfitting. One way to mitigate overfitting is to enforce nodes to share the same weights, therefore reducing the number of free parameters to be learned. A convolutional neural network is an exemplary implementation of such weight-sharing neural nets. The present disclosure is not limited to neural networks and contemplates other learning modalities, including unsupervised deep learning and probabilistic graphical models such as those described in D. Koller, N. Friedman, Probabilistic Graphical Models, Massachusetts: MIT Press (2009).

As an exemplary implementation of deep learning, at least one embodiment employs a convolutional neural networks (CNNs), which are machine-learning models that represent multi-level abstractions obtained from the data itself (e.g., MR images) for the task of image quality assessment. CNNs are composed of connected neuronal nodes with learnable parameters, where the nodes can form a hierarchical representation. More particularly, CNNs generally include an input layer, a convolutional layer, a fully connected layer, and an output layer or a loss layer (for training only). The convolutional layer performs image convolution operations with learnable filters to extract feature maps.

FIG. 1 illustrates a neural network architecture according to an exemplary implementation. The neural network shown in FIG. 1 is an example of a convolutional neural network for image analysis with a large number of layers to establish a hierarchical representation of MR images. The neural network shown in FIG. 1 primarily contains three types of layers; namely, convolutional layers, pooling layers, and fully connected layers. The convolutional layers permit extraction of image features. The pooling layers are employed for consolidation of features. The fully connected layers correspond to learning parameters for decision-making.

The specific CNN architecture shown in FIG. 1 may be used to classify a $T_2$ weighted image as either being of acceptable or unacceptable image quality in terms of diagnosis-oriented image quality (i.e., whether the image is of sufficient quality so as to be suitable for an effective diagnosis). The values shown in FIG. 1 reflect adaptation of the model for liver MR applications. This model was discussed in the context of natural images in A. Krizhevsky, I. Sutskever, G. Hinton, "ImageNet Classification with Deep Convolutional Neural Networks," Proceedings Intl. Conf. on Neural Information Processing Systems (NIPS), Lake Tahoe, Nev., Dec. 3-6 (2012), pp. 1097-1105.

The architecture shown in FIG. 1 is designed to take advantage of the structure of an input image, by using local connections and tied weights followed by pooling, which results in translation-invariant features. Such architecture with shared weights in convolutional kernels makes CNNs easier to train with far fewer parameters than fully connected networks of the same number of hidden units. The neural net is trained through back propagation.

Referring again to FIG. 1, FIG. 1 depicts a neural network having convolutional layers between pooling and two-fully connected layers added at the final stage. The fundamental optimization technique used in training the neural net is the classic stochastic gradient descent algorithm, as the weights are updated following the rule of $w_{ij}(t+1)=w_{ij}(t)+\alpha \partial w_{ij}/\partial c$ where C is the cost function, w are the neuron weights, and $\alpha$ is the learning rate.

As image quality assessment is formulated as a classification task (that is, acceptable vs. unacceptable image quality), the softmax function is used as cost function. A rectified linear unit (ReLU) is chosen as an activation function, i.e., $f(x)=\max(0,x)$, to introduce non-linearity into the neural net to handle complex mapping learning. A dropout function is used to regularize the network weight updates to avoid overfitting. Such calibration leverages the image features learned from training for low-level feature learning, and may be adapted to task-specific domains, such as the liver MR image domain. In at least one embodiment, the image features learned from training may be derived from a cohort of images (e.g., from images taken from a visual object recognition database).

Figure 2:
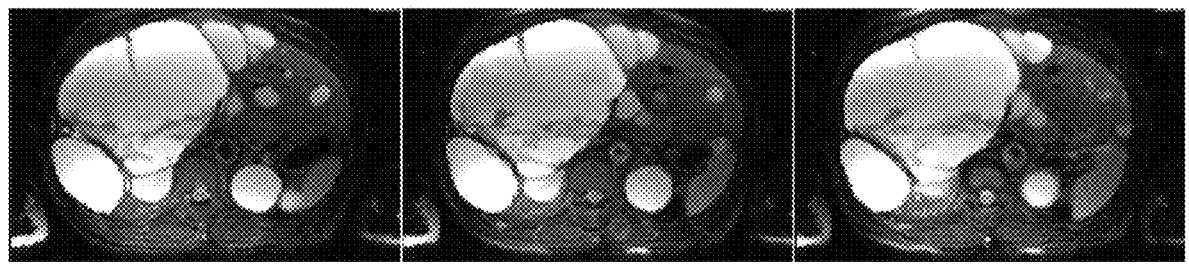
FIG. 2 illustrates representative images assessed for quality according to an exemplary implementation.

FIG. 2 illustrates representative images assessed for image quality. The following describes the process used to obtain and assess the quality of such images. First, the model shown in FIG. 1 was trained using approximately 331 $T_2$ weighted image data sets from clinical liver exams. The data sets were anonymized and collected for training. Each case was visually inspected and annotated with a label of being acceptable or unacceptable. Another independently collected and annotated set of 170 cases (validation data sets) were sequestered for blind testing. For each subject, a stack of slices of $T_2$ weighted images was available. Then, six middle 2D trans-axial slices were automatically selected, because such selection tends to cover liver, an example of an organ of interest. While the exemplary process described herein relates to $T_2$ weighted images, the present disclosure is not limited to quality assessment for the $T_2$ contrast, and images obtained for other contrasts may also be assessed.

Next, each slice was resized to 3 mm/pixel resolution and normalized to 150 pixels×150 pixels. During training, each slice was also rotated and scaled to generate more image variations in order to augment the training database. Supplementing the original data set with the additional generated images in this manner improved the robustness in the model. In total, the training data set contained 14,670 images deemed unacceptable and 15120 images deemed acceptable by human observers (such as expert radiologists). In some embodiments, only a portion of the image data may be used by the deep learning model. In some embodiments, at least one slice or a plurality of slices may be rotated and/or scaled.

To test the deep learning model, for each test case, the middle six slices were automatically selected and assessed by the learned models. Empirically, if three out of these six slices (50%) were classified as unacceptable, the test case was classified as unacceptable. Otherwise, if more than three of the six slices were classified as acceptable, then the test case was classified as acceptable. Out of the 170 sequestered test cases, 142 cases were accurately classified with accuracy of 82.5%. In other words, the deep learning model classified the test cases in the same way as the human observers 82.5% of the time.

Further, out of the 170 test cases, 28 cases were misclassified by the models against expert labels. Some of these cases were misclassified as unacceptable by the deep learning model possibly due to a large number of hepatic lesions, as shown in FIG. 2. Each of the three images shown in FIG. 2 depicts a liver MR image including a plurality of hepatic lesions. Due to the extent of such lesions within the images, such images were erroneously deemed by the deep learning model to be of unacceptable image quality, whereas human observers classified the images as being of acceptable quality (e.g., for diagnostic purposes). For example, training with additional data sets which include certain abnormalities and variations serves to improve classification (i.e., repeated training with such data sets mitigates the chance of misclassification).

In some embodiments, the deep learning model may be configured to output a classification result that is not binary (i.e., other than "acceptable" or "unacceptable"). For example, in at least one embodiment, the deep learning model may be configured to provide a quality score as a percentage or on an interval basis (e.g., an integral score on a graduated scale, such as a scale of 0-5, where 5 represents a near-perfect quality image, 3 represents an image of sufficient quality so as to be used for certain diagnoses, and 0 represents an image of negligible diagnostic value). Such a scale allows comparison of improvement in image quality. For example, certain implementations or adjustments in techniques may improve an image quality score (e.g., an increase from 3 to 4). This information can be used to facilitate developments in techniques for further enhancement of image quality assessment.

Figure 3:
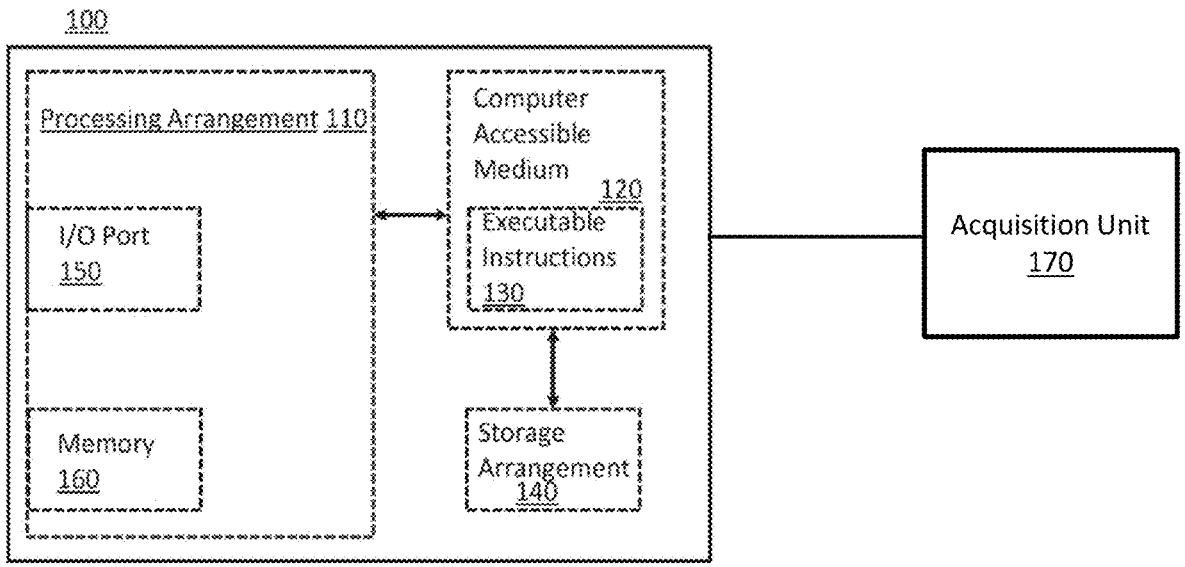
FIG. 3 illustrates a system according to an exemplary implementation.

As shown in FIG. 3, one exemplary embodiment relates to a system 100 comprising a processor or processing arrangement 110 and a tangible computer-readable medium 120 operatively connected to the processing arrangement. The computer-accessible medium 120 (e.g., as described herein, a storage device such as a hard disk, floppy disk, memory stick, CD-ROM, RAM, ROM, etc., or a collection thereof) can be in communication with the processing arrangement 110.

The computer-accessible medium 120 may be a non-transitory computer-accessible medium. The computer-accessible medium 120 can contain executable instructions 130 thereon. In addition or alternatively, a storage arrangement 140 can be provided separately from the computer-accessible medium 120, which can provide the instructions to the processing arrangement 110 so as to configure the processing arrangement to execute certain exemplary procedures, processes and methods, as described herein, for example. The instructions may include a plurality of sets of instructions. The system 100 is configured to communicate with an acquisition unit 170 (e.g., a scanner) which acquires MR images to be assessed by system 100.

System 100 may also include a display or output device, an input device such as a keyboard, mouse, touch screen or other input device, and may be connected to additional systems via a logical network. Many of the embodiments described herein may be practiced in a networked environment using logical connections to one or more remote computers having processors. Logical connections may include a local area network (LAN) and a wide area network (WAN) that are presented here by way of example and not limitation. Such networking environments are commonplace in office-wide or enterprise-wide computer networks, intranets and the Internet and may use a wide variety of different communication protocols.

Those skilled in the art can appreciate that such network computing environments can typically encompass many types of computer system configurations, including personal computers, hand-held devices, multi-processor systems, microprocessor-based or programmable consumer electronics, network PCs, minicomputers, mainframe computers, and the like. Embodiments may also be practiced in distributed computing environments where tasks are performed by local and remote processing devices that are linked (either by hardwired links, wireless links, or by a combination of hardwired or wireless links) through a communications network. In a distributed computing environment, program modules may be located in both local and remote memory storage devices.

Implementations described in this specification can be implemented in digital electronic circuitry, or in computer software, firmware, or hardware, including the structures disclosed in this specification and their structural equivalents, or in combinations of one or more of them. The implementations described in this specification can be embodied as one or more computer programs, i.e., one or more modules of computer program instructions, encoded on one or more computer storage media for execution by, or to control the operation of, a data processing apparatus.

Alternatively or in addition, the program instructions can be encoded on an artificially-generated propagated signal, e.g., a machine-generated electrical, optical, or electromagnetic signal that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially-generated propagated signal. The computer storage medium can also be, or be included in, one or more separate components or media (e.g., multiple CDs, disks, or other storage devices). Accordingly, the computer storage medium is both tangible and non-transitory.

Figure 4:
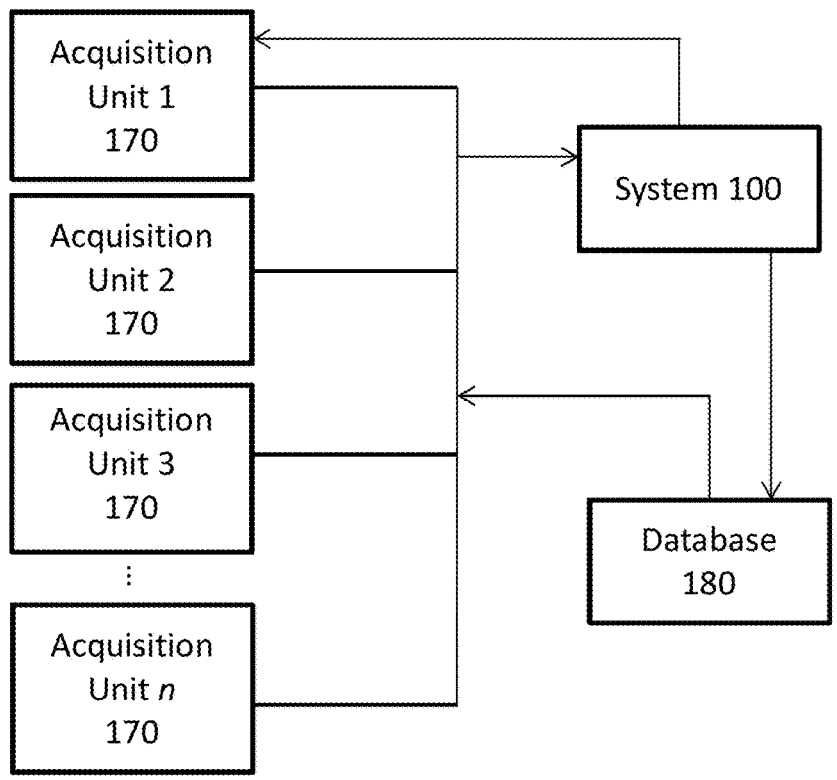
FIG. 4 illustrates an arrangement according to an exemplary implementation.

FIG. 4 illustrates an arrangement according to an exemplary implementation. One or more scanners 170 may be provided as image acquisition units in the exemplary arrangement. For example, the arrangement may include a network of scanners 170 in communication with the system 100. Data from one or more of the scanners 170 may be received by the system 100 for processing.

The system 100 is further configured to supply data to a database 180. The system 100 may supply imaging data collected from the one or more scanners 170 to the database 180. For ease of illustration, the database 180 is shown as being external to the system 100. However, in some embodiments, the system 100 may include the database 180 in a memory. The database 180 may be maintained in a local or remote server or other cloud-based storage environment so as to communicate wirelessly with system 100 and/or scanners 170, in at least one embodiment.

As seen from FIG. 4, the scanners 170, system 100, and database 180 are coupled, directly or indirectly, with each other. Such a configuration allows real-time feedback to practitioners (MR radiologists or specialists) present with the patient at the site of the scanner(s) 170, during the time of the patient's visit. For example, real-time feedback may be provided using the CNN shown in FIG. 1 to auto classify abdominal and/or liver MR image as being of either acceptable or unacceptable image quality. The system 100 is configured to provide an indication (e.g., a visual, audio, or audiovisual notification) of the classification. For example, the system 100 is configured to transmit a notification that the image quality is unacceptable by providing a warning sound or message that may be displayed at a display screen in communication with the scanner 170 from which the image of unacceptable quality was obtained.

Upon receipt of an indication that the image quality is unacceptable, the practitioners at the scan site may make corrective adjustments to the protocol while the patient is still in the scanner and/or present in the examination room. Thus, the robustness of the MR imaging may be enhanced, while reducing the costs associated with repeat scanning, additional human observation and classification of images, and reducing the burden of recalling patients. Such embodiments allow for feedback that is akin to that provided by an expert radiologist, without idiosyncratic predilections specific to any individual radiologist. That is, by providing information to the technologist at the scanning site, while an organ-of-interest remains in the scanner, the system 100 provides feedback in real-time to the technologist. The system 100 may thus decrease the extent of guesswork performed by the technologist.

Additionally, when the system 100 determines that the image quality is unacceptable, the database 180 may store a record about the specific protocol and imaging parameters associated with images classified as being of unacceptable quality. In addition, the database 180 may store technical specifications and maintenance logs for the scanner(s) 170, protocol information, failure rates, contrast information, and other information.

Further, the database 180 may be configured to automatically collect image quality data and to sort such data according to difference sequences. For example, in at least one embodiment, the sequence relates to $T_2$ weighted fat-saturated axial acquisition of a liver. The database 180 may be configured to supply feedback regarding better-performing protocols to be used (e.g., which protocols more consistently resulted in images of acceptable quality). Further, the database 180 may receive data from individual scanners 170 and may be used by the processing arrangement 110 for monitoring of individual scanners 170.

For example, the system 100 may use data from the database 180 to detect hardware and other failures, e.g., for preventative and/or early maintenance. In some embodiments, the database 180 may store information relating to diagnostic data pertaining to the hardware of scanners 170, such as fault diagnostics and error code logging. The database 180 may be consulted by system 100 to evaluate the performance of individual scanners 170, e.g., to determine whether one or more scanners 170 has images of unacceptable quality with greater frequency than one or more other scanners 170. When the system 100 determines from the data in database 180 that one or more of the scanners 170 appears to be experiencing a fault, the system 100 may output a warning notification as to the fault.

Figure 5:
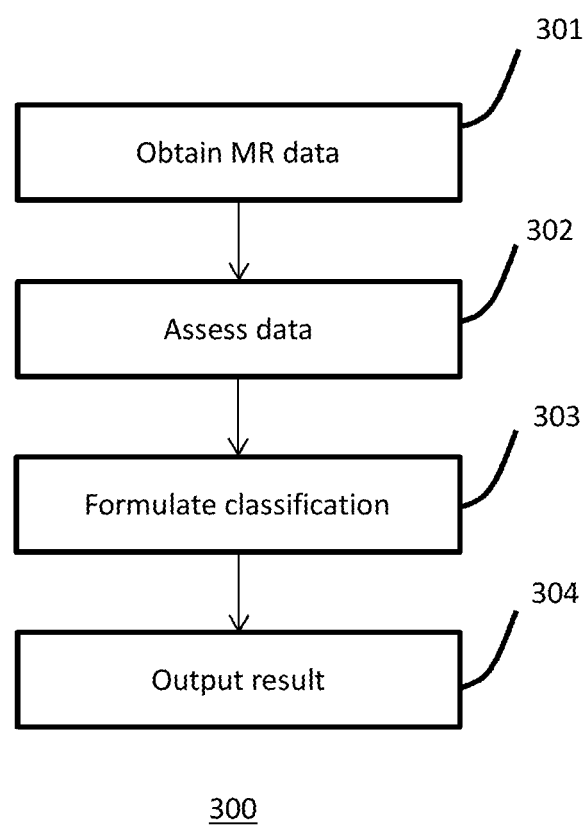
FIG. 5 illustrates a method according to an exemplary implementation.

FIG. 5 illustrates a method according to an exemplary implementation. The method 300 is a process for real-time assessment of image information employing a computer that includes one or more processors (such may be provided in the system 100). The method 300 includes obtaining, via a scanner, a magnetic resonance (MR) image of a region-of-interest (301). The method further includes providing data corresponding to at least a portion of the MR image to a deep learning model (302). The deep learning model is previously trained based on one or more sets of training data. For example, the deep learning model may be trained according to the process described above with respect to FIG. 2. The method further includes assessing the data using the deep learning model and data obtained from an image quality database to obtain an assessed image quality value or metric. The image quality value may be a binary value. In some embodiments, the image quality value may be a percentage, a graduated scale, a range of values, or a discrete value from a non-binary set, for example.

The method includes formulating an image quality classification in response to the assessed image quality value (303). For example, the image quality value may be a binary value indicative of whether the assessed quality is acceptable or unacceptable. In some embodiments, the method includes comparing the image quality value to a threshold, and determining whether the image quality is sufficient based on the results of the comparison. The method additionally includes outputting the image quality classification while the region-of-interest is present in the scanner (304). In this manner, corrective action can be taken if the image quality value is below a threshold. For example, when the image quality value is lower than a threshold, a notification may be provided that one or more aspects of the scanning protocol should be adjusted, and that the region-of-interest should be scanned anew.

Further, in some embodiments, the method includes retraining the learning model based on feedback from the database 208, including, for example, whether a prior scanning protocol resulted in a re-scan being required. For example, the learning model may be based on current models that employ newly collected samples. Such samples may be labeled to indicate that they are samples in a training set for calibration/refinement of the learning model. That is, such samples are not used to train the learning model from scratch, but instead for 'fine tuning' within an existing model, as an initialization.

Various embodiments are described in the general context of method steps, which may be implemented in one embodiment by a program product including computer-executable instructions, such as program code, executed by computers in networked environments. Generally, program modules include routines, programs, objects, components, data structures, etc. that perform particular tasks or implement particular abstract data types. Computer-executable instructions, associated data structures, and program modules represent examples of program code for executing steps of the methods disclosed herein. The particular sequence of such executable instructions or associated data structures represents examples of corresponding acts for implementing the functions described in such steps.

Software and web implementations of the present invention could be accomplished with standard programming techniques with rule based logic and other logic to accomplish the various database searching steps, correlation steps, comparison steps and decision steps. It should also be noted that the words "component" and "module," as used herein and in the claims, are intended to encompass implementations using one or more lines of software code, and/or hardware implementations, and/or equipment for receiving manual inputs.

All methods described herein can be performed in any suitable order unless otherwise indicated herein or otherwise clearly contradicted by context. The use of any and all examples, or exemplary language (e.g., "such as") provided herein, is intended merely to better illuminate the embodiments and does not pose a limitation on the scope of the claims unless otherwise stated. No language in the specification should be construed as indicating any non-claimed element as essential. In some cases, the actions recited in the claims can be performed in a different order and still achieve desirable results. In certain implementations, multitasking and parallel processing may be advantageous.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. Therefore, the above embodiments should not be taken as limiting the scope of the invention.

What is claimed is:

1. A method for real-time assessment of image information employing a computer that includes one or more processors, comprising:
    obtaining, via a scanner, a magnetic resonance (MR) image of a region-of-interest;
    providing data corresponding to at least a portion of the MR image to a deep learning model, the deep learning model being previously trained based on one or more sets of training data;
    assessing the data using the deep learning model and data obtained from an image quality database to obtain an assessed image quality value, the database being configured to store information relating to diagnostic data of the scanner;
    determining, from the information in the database, whether the scanner is experiencing a fault;
    formulating an image quality classification in response to the assessed image quality value, and
    outputting the image quality classification within a predetermined time period from an initial scan of the region-of-interest.

2. The method of claim 1, further comprising:
    retraining the deep learning model based on the assessed image quality value.

3. The method of claim 1, further comprising:
    outputting an audible and/or visual warning when an assessed image quality value of the MR image is below a threshold, while the region-of-interest is present in the scanner.

4. The method of claim 1, further comprising:
    outputting an instruction to re-scan the region-of-interest when an assessed quality value of the MR image is below a threshold.

5. The method of claim 1, wherein the image quality database is accessible via a wireless network with which the computer is configured to communicate.

6. The method of claim 1, wherein the scanner is one of a plurality of scanners, and the image quality database is further configured to store data relating to technical specifications of the plurality of scanners, protocol information associated with one or more imaging sequences, threshold data associated with image quality assessments of a plurality of MR images, and diagnostic data pertaining to hardware in the plurality of scanners.

7. The method of claim 6, further comprising:
updating the deep learning model in response to the diagnostic data.

8. The method of claim 1, further comprising:
providing one or more real-time inputs to the computer, the one or more real-time inputs relating to data other than data of the MR image.

9. A computer readable non-transitory storage medium including a processor configured to execute instructions for assessing magnetic resonance (MR) image quality, the instructions comprising:
providing imaging data from a database to a deep learning model, wherein the deep learning model incorporates training data derived from a plurality of training images;
assessing the imaging data using the deep learning model, wherein the imaging data contains at least a portion of an MR image acquired while a region-of-interest is exposed to a scanner, the database being configured to store information relating to diagnostic data of the scanner;
determining, from the information in the database, whether the scanner is experiencing a fault;
outputting an instruction to re-scan the region-of-interest when an image quality assessment of the MR image is below a threshold; and
training the deep learning model based on at least the assessment of the imaging data and based on whether or not a subsequent re-scan is performed.

10. The medium of claim 9, further comprising:
retraining the deep learning model using the image quality assessment.

11. The medium of claim 9, wherein the training data includes an initial MR image and a plurality of modified MR images based on the initial MR image, the modified MR images comprising rotated and/or scaled versions of the initial MR image.

12. The medium of claim 9, wherein the instructions cause the computer to, when the image quality assessment is below a threshold, generate one or more notifications while the region-of-interest remains exposed to the scanner.

* * * * *